United States Patent [19]

LaPierre

[11] 4,425,553

[45] Jan. 10, 1984

[54] LOW FREQUENCY PULSE GENERATOR APPARATUS

[75] Inventor: Donald C. LaPierre, West Acton, Mass.

[73] Assignee: The United States of America as represented by the Secretary of the Air Force, Washington, D.C.

[21] Appl. No.: 227,557

[22] Filed: Jan. 22, 1981

[51] Int. Cl.³ .............................................. H03K 3/03
[52] U.S. Cl. ................................. 331/74; 331/108 D; 331/143; 331/179; 331/DIG. 3
[58] Field of Search ...................... 331/74, 108 D, 111, 331/143, 177 R, 179, DIG. 3, 113 R

[56] References Cited

U.S. PATENT DOCUMENTS 3,701,040 10/1972 Borrevik et al. .................. 331/74 X
3,733,556 5/1973 Minton .............................. 331/74 X
4,110,701 8/1978 Medwin .......................... 331/111 X

OTHER PUBLICATIONS

Butt, "Emphasized Beat Metronome", Practical Electronics, vol. 14, No. 13, Sep. 1978, pp. 1010–1013.
Kartalopoulos, "Inexpensive TTL Chip Makes a Versatile Oscillator Circuit", Electronic Design, vol. 23, Jun. 7, 1975, p. 90.

Primary Examiner—Siegfried H. Grimm
Attorney, Agent, or Firm—Donald J. Singer; William Stepanishen

[57] ABSTRACT

A low frequency pulse generator apparatus utilizing an R-C timing network which includes a plurality of selectable capacitors to provide frequency pulse rates over a predetermined range. A counter which may be set to count a finite number of pulses, controls the generated pulse total.

1 Claim, 2 Drawing Figures

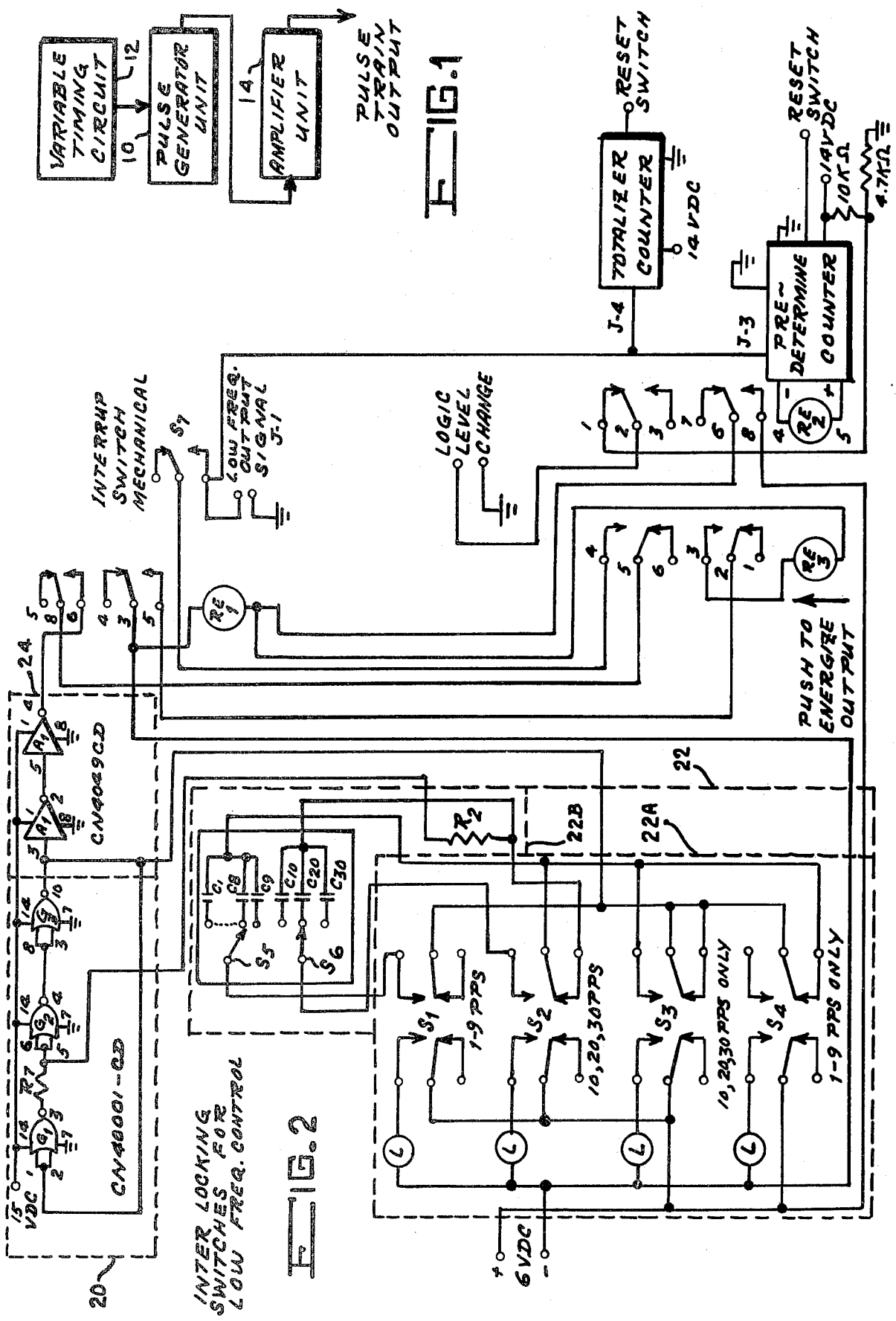

LOW FREQUENCY PULSE GENERATOR APPARATUS

STATEMENT OF GOVERNMENT INTEREST

The invention described herein may be manufactured and used by or for the Government for governmental purposes without the payment of any royalty thereon.

BACKGROUND OF THE INVENTION

The present invention relates broadly to a frequency generator apparatus, and in particular to a low frequency pulse generator apparatus.

The pulse generator is an electronic circuit which is capable of producing a waveform that rises abruptly, maintains a relatively flat top for a predetermined interval, and then abruptly falls to zero. Various circuits, such as the relaxation oscillator, have been utilized to generate a rectangular waveform having an extremely short duration, and as such are referred to as pulse generators. However, there is a class of circuits whose exclusive function is generating short-duration, rectangular waveforms and these circuits are usually specifically identified as pulse generators.

In the prior art, pulse generators of the type described above have been utilized in virtually all types of electronic systems wherein the performance of various sequential, repetitive and timing operations or precise bursts of energy are required. An example of the use of a pulse generator would be in a digital computer system to perform critical timing functions within the system. In the area of radar systems, both in the operation and testing thereof, the pulse generator finds an application in providing stable well controlled pulses.

SUMMARY OF THE INVENTION

The present invention utilizes one of a plurality of variable capacitors which may be switched into an R-C timing network to establish the pulse repetition rate of the pulse generating circuit. The output of the pulse generator unit is amplified and applied to a predetermined counter unit wherein, upon accumulation of the desired count, an interrupt signal is generated. The interrupt signal which is applied to the pulse generator unit disables the pulse output and thereby allows the generation of a predetermined number of pulses.

It is one object of the present invention, therefore, to provide an improved low frequency pulse generator apparatus.

It is another object of the invention to provide an improved low frequency pulse generator apparatus wherein the pulse sequence is terminated upon reaching a predetermined pulse count.

It is another object of the invention to provide an improved low frequency pulse generator apparatus to provide a preset total number of output pulses at a selected pulse rate.

It is yet another object of the invention to provide an improved low frequency pulse generator apparatus wherein the preselected pulse counting sequence will resume uninterrupted after an interruption in the counting sequence.

These and other advantages, objects and features of the invention will become more apparent after considering the following description taken in conjunction with the illustrative embodiment in the accompanying drawings.

BRIEF DESCRIPTION OF THE DRAWINGS

FIG. 1 is a block diagram of the low frequency pulse generator apparatus in accordance with the present invention; and FIG. 2 is a schematic diagram of the low frequency pulse generator apparatus.

DESCRIPTION OF THE PREFERRED EMBODIMENT

Referring now to FIG. 1, there is shown a low frequency pulse generator apparatus utilizing a pulse generator unit 10 to generate a pulse train output signal. The pulse rate of the pulse train output signal is established by the variable timing unit 12 which provides timing signals to the pulse generator unit 10. The variable timing unit 12 may be a simple R-C netowrk in which the capacitor is variable or different values thereof are switched in, to establish a number of timing signals for the pulse generator unit 10. The output pulse signal from the pulse generator unit 10 is applied to the amplifier unit 14 wherein the pulse signal is amplified.

Turning now to FIG. 2, there is shown a schematic diagram of the low frequency pulse generator apparatus utilizing a CN40001-CD logic chip for the pulse generator unit 20. The CN40001-CD integrated circuit is a MOSFET logic chip which comprises a four NAND logic gate. In the present apparatus only three NAND gates G1, G2, G3 are utilized to provide the pulse generator unit 20. The pulse generator unit 20 is a free running clock whose output pulse frequency is determined by the pulse rate selector unit 22.

The pulse rate selector unit 22 comprises a pulse rate range selector 22A and a variable pulse frequency timing unit 22B. The pulse rate range selector 22A comprises a plurality of selector switches for the pulse ranges, one to nine pulses per second (PPS), ten, twenty and thirty pulses per second (PPS), ten, twenty and thirty pulses per second (PPS) only, and one to nine pulses per second (PPS) only. Each of the pulse rate ranges utilizes an indicator lamp which is illuminated when a pulse rate range is selected, to indicate the selected pulse range. The variable pulse frequency timing unit 22B comprises a first and second plurality of timing capacitors, C1-C9, C10, C20 and C30 which provide the above pulse rates and a first and second switching means S5, S6. The first and second switching means S5, S6 may be any well known switching means such as a rotary wafer switch or an electro-mechanical switch which permits the connection of one or more of the plurality of timing capacitors, C1-C9, C10, C20, C30 into the R-C timing circuit of the pulse generator unit 10.

Thus, for example, if it is desired to select a pulse rate of twenty-eight pulses per second (PPS), switches S1 and S2 would switch from the normally deactivated position that is shown, to the range activated position. In the variable pulse frequency timing unit 22B, switch S5 would be positioned at the eight pulses per second rate while switch S6 would selecte the twenty pulses per second rate. It may be noted that the pulse frequency range one to nine pulses per second is represented by capacitors C1 to C9 and the pulse frequency ranges, ten, twenty and thirty pulses per second are represented by capacitors C10, C20, C30. The selection of the proper combination of capacitors in combination with resistor R2 will provide the proper R-C time constant for the pulse generator unit 20 to generate the desired pulse frequency. Thus, for the present example, switch S5 would be in position C8 and switch S6 would be in position C20 in order to generate a pulse frequency of twenty-eight pulses per second. When switches S1, S2 and switches S5, S6 are closed, it may be clearly seen that capacitors C8 and C20 are in series with each other and with resistor R2, all of which are connected from the input of gate G2 to the output of gate G3. The output of the pulse generator unit 20 is applied to an amplifier unit 24 for amplification. The amplifier unit 24 comprises an integrated circuit CD4049A in which two amplifiers A1, A2 are connected in series to amplify the low frequency pulse train. The output pulse signal from the amplifier unit 24 is applied to contact 6 which is associated with relay unit, RE1. After relay units RE1, RE3 are energized, and the interrupt switch, S7 is manually closed, the output pulse signal is applied to the output connector, J1.

The low frequency generator apparatus operates in the following manner. The principal timing for the predetermined low frequency generator is accomplished with the CN40001-CD logic chip. In order to select the number of pulses per second (the pulse rate of the pulse generator), the switches S5, S6 in pulse frequency timing unit 22B must be positioned to select an appropriate capacitor or capacitors which represent a desired pulse rate. The selected capacitors are inserted into the RC time constant network which establishes the output frequency of the pulse generator. There are nine capacitor switches for one to nine pulses per second and one each for ten, twenty, and thirty pulses per second. While a pair of rotar switches S5, S6 are shown in the present example it will be well understood that separate electromechanical alternating switches may be utilized to establish the various capacitor combinations described. In order to accomplish counts in between ten and thirty nine, the capacitors are put in series with each other via the electro mechanical switches which are shown for the ranges 1-9 pps, 10, 20, 30 pps, 10, 20, 30 and 1-9 pps only.

Once the desired pulse rate is selected the output signal from the pulse generator unit 20 circuit is applied to the amplifier unit 24 which comprises two inverting line drivers. The output signal of the final line drivers in amplifier unit 24 is applied to the open contact 6 of a control relay unit RE1 which is shown in the non-energized position. In order to energize relay unit RE1 the following procedure must be followed. The desired number of events in pulse per second are inserted by means of the manual thumb switches on the predetermined counter which has a pulse rate range of 1 to 9999. The reset for the predetermined counter must be energized to start the event count at zero. When the event count reaches zero, a voltage will appear at the plus-minus output terminals of the counter which will energize relay unit RE2. The two sets of contacts which are associated with relay unit RE2 are shown in the normally open position, are switched to the energized position. One set of contacts provides a logic level change signal which changes from high to low signal. The other set of contacts provides a voltage path to relay unit RE1 and push to energize relay unit RE3. Once relay unit RE3 is manually energized the voltage path which energizes both relay units RE1 and RE3 is completed. At this point in time, relay units RE1 and RE3 complete the signal path for the pulse generator unit output pulse signal to appear at the low frequency output jack J1.

The signal at the output jack is divided into three separate paths. One is for a desired users load. The second is for supplying a signal for totalizing events. The third is used by the predetermining digital read out. When the digital read out on the counter reaches the count set on the thumb wheels the voltage is removed from relay RE2 causing it to deactivate its contacts. This removes the signal from the low frequency output signal jack and causes the logic level to change from low to high. The high level change is wired to a voltage divider network at the predetermined counter. The counter supplies the voltage for this network. This completes the operation of the predetermined low frequency generator. While the present example of the low frequency pulse generator unit has illustrated pulse signals in the frequency range of one pulse per second to thirty nine pulses per second, it should be well understood that higher frequency may be obtained. Thus, if a particular application requires frequencies, they may be obtained by simply changing the capacitance values in the R-C timing network.

The following is a parts list for the low frequency generator as shown and described:
  (a) pulse generator unit: CM-40001-CD MOSFET Logic Chip "Quad 4 NAND gate"
  (b) Timing unit:

| Pulses per Second | Capacitor Microfarads | Resistors |
| --- | --- | --- |
| 1 | 30 | R1 — 47K |
| 2 | 8. | R2 — 39K |
| 3 | 5. | |
| 4 | 4.13 | |
| 5 | 3.55 | |
| 6 | 2.22 | |
| 7 | 1.90 | |
| 8 | 1.68 | |
| 9 | 1.66 | |
| 10 | 1.5 | |
| 20 | .94 | |
| 30 | .57 | |

(c) amplifier unit: CN4049CD line driver
  (d) predetermined counter: Mfg. Veeder Root
  (e) totalizer counter: Mfg. Veeder Root Although the invention has been described with reference to a particular embodiment, it will be understood to those skilled in the art that the invention is capable of a variety of alternative embodiments within the spirit and scope of the appended claims.

What is claimed is:
1. A low frequency pulse generator apparatus comprising in combination:
  a pulse rate selector means to generate timing control signals, said pulse rate selector means including a variable pulse timing unit to vary said timing control signals, said pulse timing unit comprises an R-C timing network which is a series resistor-capacitor circuit in which one or more capacitors of a plurality of capacitors may be connected in series with a resistor,
  a pulse generator means to generate a low frequency pulse signal, said pulse generator means receiving said timing control signals, said timing control signals controlling the frequency of said pulse signal, said pulse rate selector means comprises:
  a pulse rate range selector means to provide a plurality of pulse rate ranges, said pulse rate range selec- tor means providing a predetermined range of pulse rates, said pulse rate ranges being individually selectable, and a pulse frequency timing means to provide a variable pulse frequency timing signal, said variable pulse frequency timing signal controlling the frequency of said pulse signal from said pulse generator means, an amplifying means receiving and amplifying said pulse signal, a counter means connected to said amplifying means to receive said pulse signal, said counter means including a selective counting means for counting a predetermined number of pulses, said selective counting means providing a count complete signal when said predetermined number of pulses has been counted, a switching means to connect said pulse signal from said amplifying means to an output terminal, said switching means comprises a first, second and third switching means wherein said pulse signal is connected first through said first switching means to and through said third switching means to and through said first switching means to said counter means, said second switching means being energized by said counter means to enable said first and third switching means, said third switching means including means to manually energize said third switching means, and, an interrupt means connected between said amplifier means and said counter means, said interrupt means providing manual control over the application of said pulse signal to said counter means.

* * * * *